(12) United States Patent
Dunaway et al.

(10) Patent No.: US 6,611,054 B1
(45) Date of Patent: Aug. 26, 2003

(54) IC PACKAGE LID FOR DOSE ENHANCEMENT PROTECTION

(75) Inventors: Thomas J. Dunaway, New Hope, MN (US); Richard K. Spielberger, Maple Grove, MN (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 08/171,998

(22) Filed: Dec. 22, 1993

(51) Int. Cl.⁷ .............................................. H01L 23/12
(52) U.S. Cl. ...................................... 257/704; 257/660
(58) Field of Search .................................. 257/660, 704

(56) References Cited

U.S. PATENT DOCUMENTS 4,580,157 A * 4/1986 Honda ......................... 257/660
4,975,762 A * 12/1990 Stradley et al. ............. 257/660
5,268,533 A * 12/1993 Kovacs et al. ............... 257/704

FOREIGN PATENT DOCUMENTS

| JP | 140250 | * | 1/1980 |
| JP | 56-30745 | * | 3/1981 |
| JP | 56-158459 | * | 12/1981 |
| JP | 5718340 | * | 1/1982 |
| JP | 4-158554 | * | 6/1992 |

* cited by examiner

Primary Examiner—Roy Potter
(74) Attorney, Agent, or Firm—Matthew S. Luxton

(57) ABSTRACT

An integrated circuit package for use in radiation environments includes a base for receiving an integrated circuit die and has a peripheral surface for receiving a lid. The lid has an inner surface facing the die that has a cladding of a low atomic number material to limit electron emission due to absorbed radiation.

12 Claims, 2 Drawing Sheets

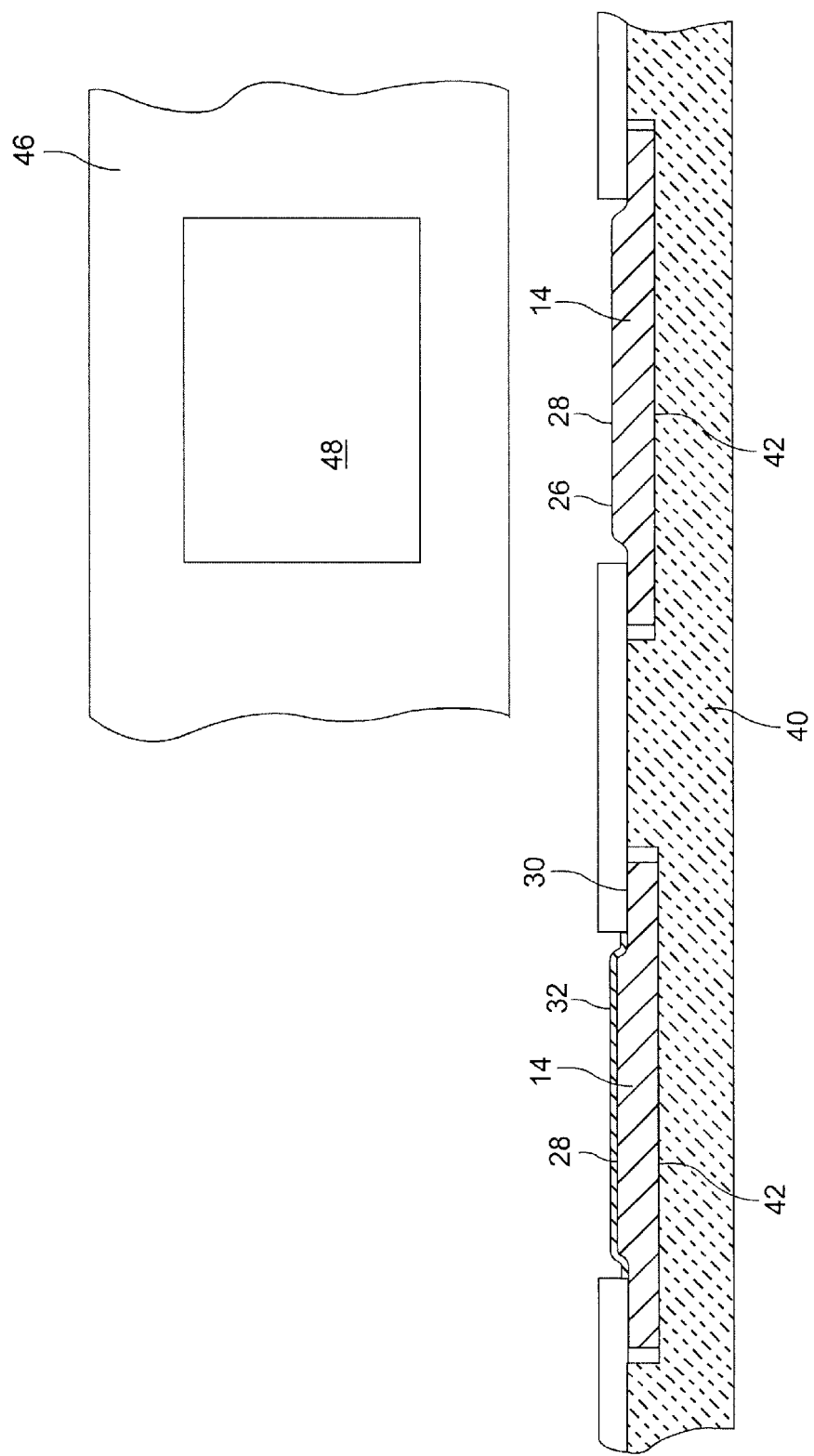

IC PACKAGE LID FOR DOSE ENHANCEMENT PROTECTION

BACKGROUND OF THE INVENTION

The present invention relates genera to integrated circuit (PC) packaging and specifically to IC packaging which provides a hermetic seal and reduces dose enhancement from secondary electrons.

In the design of IC packaging that will be used in radiation environments, attention must be given to designing the package so as to protect the circuits from damage due to radiation. Spacecraft or satellites traveling in typical earth orbits are exposed to a natural space radiation environment including gamma rays, x-rays and other high energy particles. Electrons and x-rays are the principal contributors to total dose radiation problems within a spacecraft or satellite. The type of interactions that occur between photons and the atoms in a bombarded or exposed material depends on the atomic number of the target material. X-rays become absorbed by a targeted atom and the atom emits an electron. For atoms having a high atomic number it is easier to liberate an electron than it is for atoms having a low atomic number.

The lid or cover of an IC package has an underside which is typically located near and facing the active region of the IC chip. Package lids are typically made of a nickel/iron alloy, such as kovar that has been nickel and gold plated. During package assembly the lid is typically brazed to the package with a gold/tin eutectic solder. Unfortunately the gold plated surface of the underside of the lid is facing the integrated circuit and will be a generator for electrons when the package is exposed to x-rays and other radiation. The active region of the chip is located near the top surface of the chip, and it is the dose in the active region which affects IC performance. The gold surface of the underside of the lid when bombarded with high energy particles liberates electrons to the chip surface. This electron showering of the integrated circuit can affect performance.

Thus a need exists for a package that will minimize total dose enhancement from secondary electrons.

SUMMARY OF THE INVENTION

The present invention solves these and other needs by providing an integrated circuit package for use in radiation environments which includes a base for receiving a die and a peripheral surface. A lid has a peripheral seal area that rests on the peripheral surface and an inner surface that faces the die, the inner surface has a cladding of a metal with a low atomic number to minimize electron emission due to absorbed radiation.

BRIEF DESCRIPTION OF THE DRAWINGS

FIG. 3 is a diagram of a process for depositing a metal according to the present invention.

DETAILED DESCRIPTION

Figure 1:
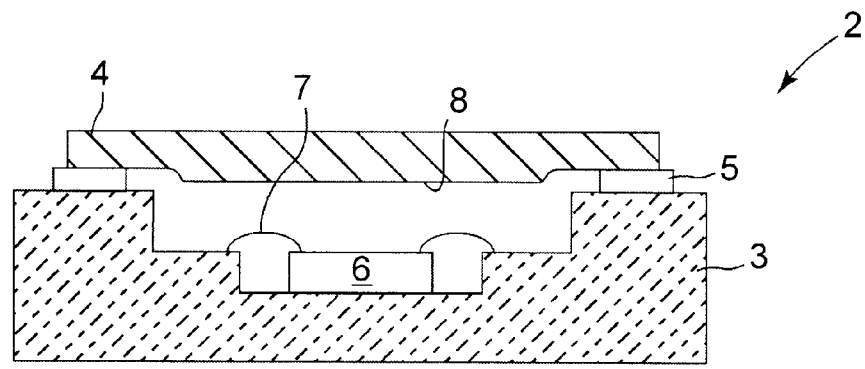
FIG. 1 is a cross section drawing which illustrates a typical metallic integrated circuit package for use in radiation environments.
Figure 2:
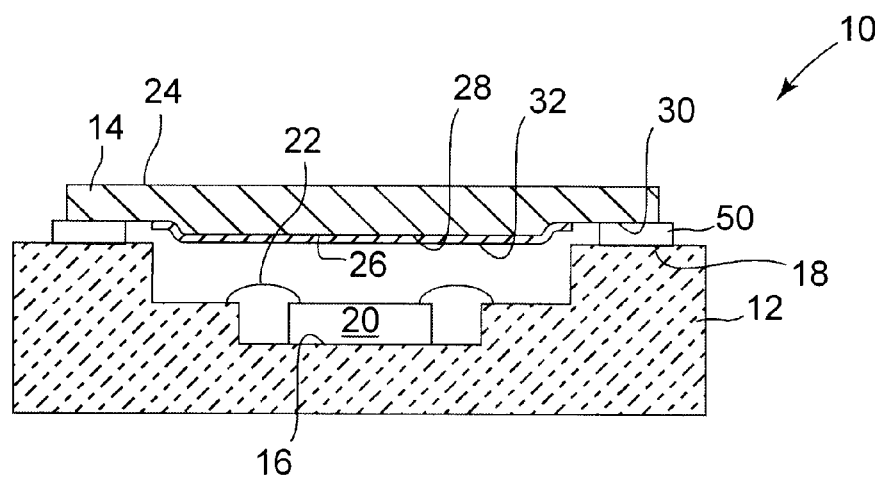
FIG. 2 is a cross section drawing of an integrated circuit package in accordance with the present invention.

A typical package for an integrated circuit intended for use in radiation environments is illustrated in FIG. 1. Package 2 includes base 3, lid 4, and seal ring 5. Seal ring 5 is typically attached to base 3 by brazing. Base 3 may be of ceramic or other material, lid 4 would typically be of nickel and gold plated kovar and seal ring 5 would be kovar. Integrated circuit die 6 rests on base 3 and has wire bonds 7 which extend from die 6 to internal conductors (not shown) within package 2. Surface 8 of lid 4 is gold plated and when subjected to radiation emits electrons which shower die 6 and affect performance.

An integrated circuit package 10 in accordance with the present invention is shown in the drawings and generally designated 10.

Package 10 includes base 12, typically of a ceramic material, and lid 14. Base 12 includes die receiving location 16 and peripheral surface 18. Integrated circuit die 20 rests on die receiving location 16 of base 12 and has wire bonds 22 which extend from die 20 to internal conductors (not shown) within base 12 which are connected to leads or pins (also not shown). Lid 14 is typically of a nickel/iron alloy such as kovar and includes outer surface 24 and inner or lower surface 26. Inner surface 26 includes a central area 28 which faces die 20 and a peripheral area 30. Central area 28 in accordance with the present invention has a layer of a material having a low atomic number for example, aluminum or titanium. Central area 28 therefore has a cladding of a material having a low atomic number.

Cladding 32 may be applied to central area 28 of lower surface 26 of lid 14 by a variety of known methods, such as sputtering, plating and evaporation. One approach for the application of aluminum cladding 32, for example, is the use of a sputtering system as illustrated in FIG. 3. Holder or carrier 40 is shown which will accept two lids 14 resting on carrier surface 42. By the use of a shadow mask 46 having openings 48 only the portion of surface 26 that is to receive aluminum cladding is exposed. Aluminum may then be vacuum deposited on the exposed surface 28 of lid 14. The result will be a lid as shown with aluminum cladding 32. It is important not to have aluminum in peripheral or seal area 30 since it will interfere with lid sealing such as welding or soldering, When sealing is to be by welding, then package 10 further includes seal ring 50 preferably made of kovar. Seal ring 50 rests on surface 18 of base 12 and can be secured by brazing. Lid 14 can be secured to seal ring 50 by parallel seam welding where package 10 including base 12 and lid 14 are passed under electrode wheels which are in contact with lid 14 to effect a weld. When sealing is to be by soldering, lid 14 is brazed to base 12 with, for example, a gold/tin eutectic solder.

An alternative to the shadow mask previously described is to use polyimide tape to mask off the seal area 30. Polyimide tape has been successfully used to mask off seal area 30 after sputtering approximately 25 microns of aluminum.

As another alternative to the shadow masking method previously described, a solder preform may be used as a mask during aluminum deposition and then removed after the deposition. This removal exposes the masked off seal area that can then be furnace sealed or welded without having the aluminum interfere with the sealing process.

Now that the construction of package 10 has been set forth, many advantages may be described and appreciated. With die 20 located in package 10 and lid 14 in place it is clear that cladding 32 of lid 14 is located directly above the active circuit portion of die 20. This is in contrast to the package arrangement of FIG. 1 where kovar lid 4 with nickel and gold plating on surface 8 is located directly above die 6.

When high energy particles bombard the gold plated surface of lid 4, electrons are released which in turn bombard die 6. The gold plating (atomic number=79) thus contributes to dose enhancement while the aluminum cladding 32, for example, (atomic number=13) of the present invention provides a greatly reduced contribution to dose enhancement.

In accordance with the foregoing description, Applicants have developed an integrated circuit package that can be used to limit electron emission due to absorbed radiation. Although specific embodiments embodiments of Applicants' invention have been shown and described for illustrative purposes, a number of variations and modifications will be apparent to those of ordinary skill in the relevant arts. It is not intended that coverage be limited to the disclosed embodiments, but only by the terms of the following claims.

What is claimed is:

1. An integrated circuit package for use in radiation environments, comprising:

a base having a die receiving location and a peripheral surface;

a lid for receipt on said peripheral surface, said lid having an outer surface and an inner surface, said inner surface having a peripheral seal area and a die facing area, said outer surface and said peripheral seal area plated with a first metal, said die facing area having a cladding of a second metal, said second metal selected to have a low atomic number relative to an atomic number of said first metal in order to limit electron emission due to absorbed radiation; and sealing means located between said peripheral surface and said peripheral seal area.

2. Integrated circuit package of claim 1 wherein said first metal includes gold and said second metal is aluminum.

3. Integrated circuit package of claim 1 wherein said sealing means comprises a seal ring and said seal is effected by welding.

4. Integrated circuit package of claim 2 wherein said sealing means comprises a seal ring and said seal is effected by welding.

5. Integrated circuit package of claim 1 wherein said sealing means is effected by solder reflow means.

6. Integrated circuit package of claim 2 wherein said sealing means is effected by solder reflow means.

7. Integrated circuit package of claim 1 wherein said first metal includes gold and said second metal is titanium.

8. A package for use in radiation environments for electrically connecting an integrated circuit die to an external circuit, said package comprising:

a base having a first area for receiving said die and a second area;

a lid having a first side, said first side having a central area facing said first area and a peripheral area for complimentary receipt on said second area of said base, said peripheral area having a coating of a first metal, said central area having a coating of a second metal, said second metal having a low atomic number relative to said first metal.

9. Package of claim 8 wherein said coating of said second metal is formed by masking said peripheral area and vacuum depositing said second metal.

10. Package of claim 9 wherein said first metal is gold and said second metal is aluminum.

11. Page of claim 8 wherein said first metal is gold and said second metal is titanium.

12. In an integrated circuit package for use in radiation environments, said package having a first surface area for receiving a die and a second surface area for receiving a lid, the improvement comprising:

said lid having an inner surface portion facing said die, said inner surface portion having an aluminum cladding to limit electron emission due to absorbed radiation.

\* \* \* \* \*